(12) United States Patent
Harris et al.

(10) Patent No.: US 7,268,533 B2
(45) Date of Patent: Sep. 11, 2007

(54) OPTICAL TESTING DEVICE

(75) Inventors: Daniel L. Harris, Beaverton, OR (US); Peter R. McCann, Beaverton, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 0 days.

(21) Appl. No.: 10/912,789

(22) Filed: Aug. 6, 2004

(65) Prior Publication Data

US 2005/0007581 A1 Jan. 13, 2005

(51) Int. Cl.
*G01R 31/02* (2006.01)
*B25B 11/00* (2006.01)

(52) U.S. Cl. ...................... 324/158.1; 269/21

(58) Field of Classification Search ............... 324/754, 324/765, 158.1, 72.5, 758
See application file for complete search history.

(56) References Cited

U.S. PATENT DOCUMENTS

| | | | |
|---|---|---|---|
| 1,337,866 A | 4/1920 | Whitaker | |
| 2,142,625 A | 1/1939 | Zoethout | |
| 2,197,081 A | 4/1940 | Piron | |
| 2,376,101 A | 5/1945 | Tyzzer | |
| 2,389,668 A | 11/1945 | Johnson | |
| 2,471,897 A | 5/1949 | Rappl | |
| 2,812,502 A | 11/1957 | Doherty | |
| 3,176,091 A | 3/1965 | Hanson et al. | |
| 3,185,927 A | 5/1965 | Margulis et al. | |
| 3,192,844 A * | 7/1965 | Szasz et al. ................ | 355/78 |
| 3,193,712 A | 7/1965 | Harris | |
| 3,201,721 A | 8/1965 | Voelcker | |
| 3,230,299 A | 1/1966 | Radziejowski | |
| 3,256,484 A | 6/1966 | Terry | |
| 3,265,969 A | 8/1966 | Catu | |
| 3,289,046 A | 11/1966 | Carr | |
| 3,333,274 A | 7/1967 | Forcier | |
| 3,405,361 A | 10/1968 | Kattner et al. | |
| 3,408,565 A | 10/1968 | Frick et al. | |
| 3,435,185 A | 3/1969 | Gerard | |
| 3,484,679 A | 12/1969 | Hodgson et al. | |
| 3,596,228 A | 7/1971 | Reed, Jr. et al. | |
| 3,602,845 A | 8/1971 | Agrios et al. | |
| 3,609,539 A | 9/1971 | Gunthert | |
| 3,648,169 A | 3/1972 | Wiesler | |
| 3,654,573 A | 4/1972 | Graham | |
| 3,662,318 A | 5/1972 | Decuyper | |

(Continued)

FOREIGN PATENT DOCUMENTS

DE  31 14 466  3/1982

(Continued)

OTHER PUBLICATIONS

Christophe Risacher, Vessen Vassilev, Alexey Pavolotsky, and Victor Belitsky, "Waveguide-to-Microstrip Transition With Integrated Bias-T," IEEE Microwave and Wireless Components Letters, vol. 13, No. 7, Jul. 2003, pp. 262-264.

(Continued)

*Primary Examiner*—Ernest Karlsen
(74) *Attorney, Agent, or Firm*—Chernoff, Vilhauer, McClung & Stenzel

(57) ABSTRACT

A chuck adapted to test electrical and/or optical components on a device-under-test (DUT).

4 Claims, 6 Drawing Sheets

U.S. PATENT DOCUMENTS

| | | |
|---|---|---|
| 3,710,251 A | 1/1973 | Hagge et al. |
| 3,714,572 A | 1/1973 | Ham et al. |
| 3,775,644 A | 11/1973 | Cotner et al. |
| 3,777,260 A | 12/1973 | Davies et al. |
| 3,810,017 A | 5/1974 | Wiesler et al. |
| 3,814,888 A | 6/1974 | Bowers et al. |
| 3,829,076 A | 8/1974 | Sofy |
| 3,863,181 A | 1/1975 | Glance et al. |
| 3,866,093 A | 2/1975 | Kusters et al. |
| 3,930,809 A | 1/1976 | Evans |
| 3,936,743 A | 2/1976 | Roch |
| 3,970,934 A | 7/1976 | Aksu |
| 3,996,517 A | 12/1976 | Fergason et al. |
| 4,001,685 A | 1/1977 | Roch |
| 4,008,900 A | 2/1977 | Khoshaba |
| 4,009,456 A | 2/1977 | Hopfer |
| 4,027,253 A | 5/1977 | Chiron et al. |
| 4,035,723 A | 7/1977 | Kvaternik |
| 4,038,894 A | 8/1977 | Knibbe et al. |
| 4,042,119 A | 8/1977 | Hassan et al. |
| 4,049,252 A | 9/1977 | Bell |
| 4,066,943 A | 1/1978 | Roch |
| 4,093,988 A | 6/1978 | Scott |
| 4,099,120 A | 7/1978 | Aksu |
| 4,115,735 A | 9/1978 | Stanford |
| 4,115,736 A | 9/1978 | Tracy |
| 4,116,523 A | 9/1978 | Coberly et al. |
| 4,151,465 A | 4/1979 | Lenz |
| 4,161,692 A | 7/1979 | Tarzwell |
| 4,172,993 A | 10/1979 | Leach |
| 4,186,338 A | 1/1980 | Fichtenbaum |
| 4,275,446 A | 6/1981 | Blaess |
| 4,280,112 A | 7/1981 | Eisenhart |
| 4,284,033 A | 8/1981 | delRio |
| 4,284,682 A | 8/1981 | Frosch et al. |
| 4,287,473 A | 9/1981 | Sawyer |
| 4,342,958 A | 8/1982 | Russell |
| 4,346,355 A | 8/1982 | Tsukii |
| 4,352,061 A | 9/1982 | Matrone |
| 4,357,575 A | 11/1982 | Uren et al. |
| 4,365,109 A | 12/1982 | O'Loughlin |
| 4,365,195 A | 12/1982 | Stegens |
| 4,371,742 A | 2/1983 | Manly |
| 4,376,920 A | 3/1983 | Smith |
| 4,383,178 A | 5/1983 | Shibata et al. |
| 4,414,638 A | 11/1983 | Talambrias |
| 4,419,626 A | 12/1983 | Cedrone et al. |
| 4,425,395 A | 1/1984 | Negishi et al. |
| 4,426,619 A | 1/1984 | Demand |
| 4,473,798 A | 9/1984 | Cedrone et al. |
| 4,479,690 A | 10/1984 | Inouye et al. |
| 4,480,223 A | 10/1984 | Aigo |
| 4,487,996 A | 12/1984 | Rabinowitz et al. |
| 4,491,173 A | 1/1985 | Demand |
| 4,503,335 A | 3/1985 | Takahashi |
| 4,507,602 A | 3/1985 | Aguirre |
| 4,528,504 A | 7/1985 | Thornton, Jr. et al. |
| 4,531,474 A | 7/1985 | Inuta |
| 4,532,423 A | 7/1985 | Tojo et al. |
| 4,557,599 A | 12/1985 | Zimring |
| 4,566,184 A | 1/1986 | Higgins et al. |
| 4,567,321 A | 1/1986 | Harayama |
| 4,567,908 A | 2/1986 | Bolsterli |
| 4,575,676 A | 3/1986 | Palkuti |
| 4,588,970 A | 5/1986 | Donecker et al. |
| 4,621,169 A | 11/1986 | Petinelli et al. |
| 4,626,618 A | 12/1986 | Takaoka et al. |
| 4,642,417 A | 2/1987 | Ruthrof et al. |
| 4,646,005 A | 2/1987 | Ryan |
| 4,665,360 A | 5/1987 | Phillips |
| 4,673,839 A | 6/1987 | Veenendaal |
| 4,675,600 A | 6/1987 | Gergin |
| 4,680,538 A | 7/1987 | Dalman et al. |
| 4,684,883 A | 8/1987 | Ackerman et al. |
| 4,691,831 A | 9/1987 | Suzuki et al. |
| 4,694,245 A | 9/1987 | Frommes |
| 4,695,794 A | 9/1987 | Bargett et al. |
| 4,697,143 A | 9/1987 | Lockwood et al. |
| 4,703,433 A | 10/1987 | Sharrit |
| 4,711,563 A | 12/1987 | Lass |
| 4,712,370 A | 12/1987 | MacGee |
| 4,727,637 A | 3/1988 | Buckwitz et al. |
| 4,730,158 A | 3/1988 | Kasai et al. |
| 4,731,577 A | 3/1988 | Logan |
| 4,734,872 A | 3/1988 | Eager et al. |
| 4,739,259 A | 4/1988 | Hadwin et al. |
| 4,744,041 A | 5/1988 | Strunk et al. |
| 4,755,746 A | 7/1988 | Mallory et al. |
| 4,755,874 A | 7/1988 | Esrig et al. |
| 4,757,255 A | 7/1988 | Margozzi |
| 4,758,785 A | 7/1988 | Rath |
| 4,759,712 A | 7/1988 | Demand |
| 4,771,234 A | 9/1988 | Cook et al. |
| 4,772,846 A | 9/1988 | Reeds |
| 4,777,434 A | 10/1988 | Miller et al. |
| 4,783,625 A | 11/1988 | Harry et al. |
| 4,784,213 A | 11/1988 | Eager et al. |
| 4,786,867 A | 11/1988 | Yamatsu |
| 4,787,752 A | 11/1988 | Fraser et al. |
| 4,791,363 A | 12/1988 | Logan |
| 4,810,981 A | 3/1989 | Herstein |
| 4,812,754 A | 3/1989 | Tracy et al. |
| 4,816,767 A | 3/1989 | Cannon et al. |
| 4,818,169 A | 4/1989 | Schram et al. |
| 4,827,211 A | 5/1989 | Strid et al. |
| 4,838,802 A | 6/1989 | Soar |
| 4,839,587 A | 6/1989 | Flatley et al. |
| 4,845,426 A | 7/1989 | Nolan et al. |
| 4,849,689 A | 7/1989 | Gleason |
| 4,853,613 A | 8/1989 | Sequeira et al. |
| 4,856,426 A | 8/1989 | Wirz |
| 4,856,904 A | 8/1989 | Akagawa |
| 4,858,160 A | 8/1989 | Strid et al. |
| 4,859,989 A | 8/1989 | McPherson |
| 4,871,883 A | 10/1989 | Guiol |
| 4,871,965 A | 10/1989 | Elbert et al. |
| 4,884,026 A | 11/1989 | Hayakawa et al. |
| 4,884,206 A | 11/1989 | Mate |
| 4,888,550 A | 12/1989 | Reid |
| 4,893,914 A | 1/1990 | Hancock et al. |
| 4,894,612 A | 1/1990 | Drake et al. |
| 4,896,109 A | 1/1990 | Rauscher |
| 4,899,998 A | 2/1990 | Teramachi |
| 4,904,933 A | 2/1990 | Snyder et al. |
| 4,904,935 A | 2/1990 | Calma et al. |
| 4,906,920 A | 3/1990 | Huff et al. |
| 4,916,398 A | 4/1990 | Rath |
| 4,918,279 A | 4/1990 | Babel et al. |
| 4,918,374 A | 4/1990 | Stewart et al. |
| 4,923,407 A | 5/1990 | Rice et al. |
| 4,926,118 A | 5/1990 | O'Connor et al. |
| 4,933,634 A | 6/1990 | Cuzin et al. |
| 4,968,931 A | 11/1990 | Littlebury et al. |
| 4,978,907 A | 12/1990 | Smith |
| 4,978,914 A | 12/1990 | Akimoto et al. |
| 4,982,153 A | 1/1991 | Collins et al. |
| 4,994,737 A | 2/1991 | Carlton et al. |
| 5,001,423 A | 3/1991 | Abrami et al. |
| 5,006,796 A | 4/1991 | Burton et al. |
| 5,010,296 A | 4/1991 | Okada et al. |
| 5,019,692 A | 5/1991 | Nbedi et al. |
| 5,030,907 A | 7/1991 | Yih et al. |
| 5,034,688 A | 7/1991 | Moulene et al. |
| 5,041,782 A | 8/1991 | Marzan |

| | | | | | |
|---|---|---|---|---|---|
| 5,045,781 A | 9/1991 | Gleason et al. | 5,493,236 A | 2/1996 | Ishii et al. |
| 5,061,823 A | 10/1991 | Carroll | 5,500,606 A | 3/1996 | Holmes |
| 5,065,089 A | 11/1991 | Rich | 5,506,515 A | 4/1996 | Godshalk et al. |
| 5,065,092 A | 11/1991 | Sigler | 5,508,631 A | 4/1996 | Manku et al. |
| 5,066,357 A | 11/1991 | Smyth, Jr. et al. | 5,510,792 A | 4/1996 | Ono et al. |
| 5,070,297 A | 12/1991 | Kwon et al. | 5,511,010 A | 4/1996 | Burns |
| 5,077,523 A | 12/1991 | Blanz | 5,515,167 A | 5/1996 | Ledger et al. |
| 5,084,671 A | 1/1992 | Miyata et al. | 5,517,111 A | 5/1996 | Shelor |
| 5,089,774 A | 2/1992 | Nakano | 5,521,522 A | 5/1996 | Abe et al. |
| 5,091,691 A | 2/1992 | Kamieniecki et al. | 5,523,694 A | 6/1996 | Cole, Jr. |
| 5,095,891 A | 3/1992 | Reitter | 5,530,371 A | 6/1996 | Perry et al. |
| 5,097,207 A | 3/1992 | Blanz | 5,530,372 A | 6/1996 | Lee et al. |
| 5,101,149 A | 3/1992 | Adams et al. | 5,532,609 A | 7/1996 | Harwood et al. |
| 5,101,453 A | 3/1992 | Rumbaugh | 5,539,323 A | 7/1996 | Davis, Jr. |
| 5,103,169 A | 4/1992 | Heaton et al. | 5,546,012 A | 8/1996 | Perry et al. |
| 5,105,148 A | 4/1992 | Lee | 5,550,480 A | 8/1996 | Nelson et al. |
| 5,105,181 A | 4/1992 | Ross | 5,550,482 A | 8/1996 | Sano |
| 5,107,076 A | 4/1992 | Bullock et al. | 5,552,716 A | 9/1996 | Takahashi et al. |
| 5,142,224 A | 8/1992 | Smith et al. | 5,561,377 A | 10/1996 | Strid et al. |
| 5,144,228 A | 9/1992 | Sorna et al. | 5,561,585 A | 10/1996 | Barnes et al. |
| 5,159,752 A | 11/1992 | Mahant-Shetti et al. | 5,565,788 A | 10/1996 | Burr et al. |
| 5,160,883 A | 11/1992 | Blanz | 5,571,324 A | 11/1996 | Sago et al. |
| 5,164,661 A | 11/1992 | Jones | 5,572,398 A | 11/1996 | Federlin et al. |
| 5,166,606 A | 11/1992 | Blanz | 5,583,445 A | 12/1996 | Mullen |
| 5,172,049 A | 12/1992 | Kiyokawa et al. | 5,594,358 A | 1/1997 | Ishikawa et al. |
| 5,198,752 A | 3/1993 | Miyata et al. | 5,604,444 A | 2/1997 | Harwood et al. |
| 5,198,753 A | 3/1993 | Hamburgen | 5,610,529 A | 3/1997 | Schwindt |
| 5,198,756 A | 3/1993 | Jenkins et al. | 5,611,946 A | 3/1997 | Leong et al. |
| 5,198,758 A | 3/1993 | Iknaian et al. | 5,617,035 A | 4/1997 | Swapp |
| 5,202,558 A | 4/1993 | Barker | 5,629,631 A | 5/1997 | Perry et al. |
| 5,210,485 A | 5/1993 | Kreiger et al. | 5,631,571 A | 5/1997 | Spaziani et al. |
| 5,214,243 A | 5/1993 | Johnson | 5,640,101 A | 6/1997 | Kuji et al. |
| 5,214,374 A | 5/1993 | St. Onge | 5,646,538 A | 7/1997 | Lide et al. |
| 5,218,185 A | 6/1993 | Gross | 5,657,394 A | 8/1997 | Schwartz et al. |
| 5,220,277 A | 6/1993 | Reitinger | 5,659,255 A | 8/1997 | Strid et al. |
| 5,221,905 A | 6/1993 | Bhangu et al. | 5,663,653 A | 9/1997 | Schwindt et al. |
| 5,225,037 A | 7/1993 | Elder et al. | 5,666,063 A | 9/1997 | Abercrombie et al. |
| 5,225,796 A | 7/1993 | Williams et al. | 5,668,470 A | 9/1997 | Shelor |
| 5,237,267 A | 8/1993 | Harwood et al. | 5,669,316 A | 9/1997 | Faz et al. |
| 5,266,889 A * | 11/1993 | Harwood et al. ............ 324/754 | 5,670,888 A | 9/1997 | Cheng |
| 5,278,494 A | 1/1994 | Obigane | 5,675,499 A | 10/1997 | Lee et al. |
| 5,280,156 A | 1/1994 | Niori et al. | 5,675,932 A | 10/1997 | Mauney |
| 5,303,938 A | 4/1994 | Miller et al. | 5,676,360 A | 10/1997 | Boucher et al. |
| 5,309,088 A | 5/1994 | Chen | 5,680,039 A | 10/1997 | Mochizuki et al. |
| 5,315,237 A | 5/1994 | Iwakura et al. | 5,682,337 A | 10/1997 | El-Fishaway et al. |
| 5,321,352 A | 6/1994 | Takebuchi | 5,685,232 A | 11/1997 | Inoue |
| 5,325,052 A | 6/1994 | Yamashita | 5,712,571 A | 1/1998 | O'Donoghue |
| 5,334,931 A | 8/1994 | Clarke et al. | 5,729,150 A | 3/1998 | Schwindt |
| 5,336,989 A | 8/1994 | Hofer | 5,731,708 A | 3/1998 | Sobhami |
| 5,345,170 A | 9/1994 | Schwindt et al. | 5,773,951 A | 6/1998 | Markowski et al. |
| 5,369,370 A | 11/1994 | Stratmann et al. | 5,777,485 A | 7/1998 | Tanaka et al. |
| 5,371,457 A | 12/1994 | Lipp | 5,798,652 A | 8/1998 | Taraci |
| 5,373,231 A | 12/1994 | Boll et al. | 5,802,856 A | 9/1998 | Schaper et al. |
| 5,382,898 A | 1/1995 | Subramanian | 5,804,982 A | 9/1998 | Lo et al. |
| 5,397,855 A | 3/1995 | Ferlier | 5,804,983 A | 9/1998 | Nakajima et al. |
| 5,404,111 A * | 4/1995 | Mori et al. ................ 324/758 | 5,807,107 A | 9/1998 | Bright et al. |
| 5,408,189 A | 4/1995 | Swart et al. | 5,811,751 A | 9/1998 | Leong et al. |
| 5,410,259 A | 4/1995 | Fujihara et al. | 5,828,225 A | 10/1998 | Obikane et al. |
| 5,422,574 A | 6/1995 | Kister | 5,831,442 A | 11/1998 | Heigl |
| 5,434,512 A | 7/1995 | Schwindt et al. | 5,835,997 A | 11/1998 | Yassine |
| 5,451,884 A | 9/1995 | Sauerland | 5,838,161 A | 11/1998 | Akram et al. |
| 5,457,398 A | 10/1995 | Schwindt et al. | 5,847,569 A | 12/1998 | Ho et al. |
| 5,461,328 A | 10/1995 | Devereaux et al. | 5,848,500 A | 12/1998 | Kirk |
| 5,469,324 A | 11/1995 | Henderson et al. | 5,857,667 A * | 1/1999 | Lee ............................ 269/21 |
| 5,475,316 A | 12/1995 | Hurley et al. | 5,861,743 A | 1/1999 | Pye et al. |
| 5,477,011 A | 12/1995 | Singles et al. | 5,869,975 A | 2/1999 | Strid et al. |
| 5,479,108 A | 12/1995 | Cheng | 5,874,361 A | 2/1999 | Collins et al. |
| 5,479,109 A | 12/1995 | Lau et al. | 5,879,289 A | 3/1999 | Yarush et al. |
| 5,481,936 A | 1/1996 | Yanagisawa | 5,883,522 A | 3/1999 | O'Boyle |
| 5,486,975 A | 1/1996 | Shamouilian et al. | 5,883,523 A | 3/1999 | Ferland et al. |
| 5,488,954 A | 2/1996 | Sleva et al. | 5,892,539 A | 4/1999 | Colvin |
| 5,491,426 A | 2/1996 | Small | 5,900,737 A | 5/1999 | Graham et al. |
| 5,493,070 A | 2/1996 | Habu | 5,903,143 A | 5/1999 | Mochizuki et al. |

| | | | | | | |
|---|---|---|---|---|---|---|
| 5,910,727 | A | 6/1999 | Fujihara et al. | 6,320,396 | B1 | 11/2001 | Nikawa |
| 5,916,689 | A | 6/1999 | Collins et al. | 6,335,628 | B2 | 1/2002 | Schwindt et al. |
| 5,923,177 | A | 7/1999 | Wardwell | 6,362,636 | B1 | 3/2002 | Peters et al. |
| 5,942,907 | A | 8/1999 | Chiang | 6,380,751 | B2 | 4/2002 | Harwood et al. |
| 5,945,836 | A | 8/1999 | Sayre et al. | 6,396,296 | B1 | 5/2002 | Tarter et al. |
| 5,949,579 | A | 9/1999 | Baker | 6,407,560 | B1 | 6/2002 | Walraven et al. |
| 5,952,842 | A | 9/1999 | Fujimoto | 6,424,141 | B1 | 7/2002 | Hollman et al. |
| 5,959,461 | A | 9/1999 | Brown et al. | 6,445,202 | B1 | 9/2002 | Cowan et al. |
| 5,960,411 | A | 9/1999 | Hartman et al. | 6,480,013 | B1 | 11/2002 | Nayler et al. |
| 5,963,027 | A | 10/1999 | Peters | 6,483,327 | B1 | 11/2002 | Bruce et al. |
| 5,963,364 | A | 10/1999 | Leong et al. | 6,483,336 | B1 | 11/2002 | Harris et al. |
| 5,973,505 | A | 10/1999 | Strid et al. | 6,486,687 | B2 | 11/2002 | Harwood et al. |
| 5,982,166 | A | 11/1999 | Mautz | 6,488,405 | B1 | 12/2002 | Eppes et al. |
| 5,995,914 | A | 11/1999 | Cabot | 6,489,789 | B2 | 12/2002 | Peters et al. |
| 5,998,768 | A | 12/1999 | Hunter et al. | 6,492,822 | B2 | 12/2002 | Schwindt et al. |
| 5,999,268 | A | 12/1999 | Yonezawa et al. | 6,501,289 | B1 | 12/2002 | Takekoshi |
| 6,001,760 | A | 12/1999 | Katsuda et al. | 6,549,022 | B1 | 4/2003 | Cole, Jr. et al. |
| 6,002,263 | A | 12/1999 | Peters et al. | 6,549,026 | B1 | 4/2003 | Dibattista et al. |
| 6,002,426 | A | 12/1999 | Back et al. | 6,549,106 | B2 | 4/2003 | Martin |
| 6,013,586 | A | 1/2000 | McGhee et al. | 6,573,702 | B2 | 6/2003 | Marcuse et al. |
| 6,023,209 | A | 2/2000 | Faulkner et al. | 6,605,951 | B1 | 8/2003 | Cowan |
| 6,028,435 | A | 2/2000 | Nikawa | 6,605,955 | B1 * | 8/2003 | Costello et al. .............. 324/760 |
| 6,029,141 | A | 2/2000 | Bezos et al. | 6,608,494 | B1 | 8/2003 | Bruce et al. |
| 6,031,383 | A | 2/2000 | Streib et al. | 6,608,496 | B1 | 8/2003 | Strid et al. |
| 6,034,533 | A | 3/2000 | Tervo et al. | 6,617,862 | B1 | 9/2003 | Bruce |
| 6,037,785 | A | 3/2000 | Higgins | 6,621,082 | B2 | 9/2003 | Morita et al. |
| 6,037,793 | A | 3/2000 | Miyazawa et al. | 6,624,891 | B2 | 9/2003 | Marcus et al. |
| 6,043,667 | A | 3/2000 | Cadwallader et al. | 6,633,174 | B1 | 10/2003 | Satya et al. |
| 6,049,216 | A | 4/2000 | Yang et al. | 6,636,059 | B2 | 10/2003 | Harwood et al. |
| 6,052,653 | A | 4/2000 | Mazur et al. | 6,639,415 | B2 | 10/2003 | Peters et al. |
| 6,054,869 | A | 4/2000 | Hutton et al. | 6,642,732 | B2 | 11/2003 | Cowan et al. |
| 6,060,888 | A | 5/2000 | Blackham et al. | 6,643,597 | B1 | 11/2003 | Dunsmore |
| 6,060,891 | A | 5/2000 | Hembree et al. | 6,686,753 | B1 | 2/2004 | Kitahata |
| 6,078,183 | A | 6/2000 | Cole, Jr. | 6,701,265 | B2 | 3/2004 | Hill et al. |
| 6,091,236 | A | 7/2000 | Piety et al. | 6,710,798 | B1 | 3/2004 | Hershel et al. |
| 6,091,255 | A | 7/2000 | Godfrey | 6,720,782 | B2 | 4/2004 | Schwindt et al. |
| 6,096,567 | A | 8/2000 | Kaplan et al. | 6,724,205 | B1 | 4/2004 | Hayden et al. |
| 6,104,203 | A | 8/2000 | Costello et al. | 6,724,928 | B1 | 4/2004 | Davis |
| 6,111,419 | A | 8/2000 | Lefever et al. | 6,734,687 | B1 | 5/2004 | Ishitani et al. |
| 6,114,865 | A | 9/2000 | Lagowski et al. | 6,744,268 | B2 | 6/2004 | Hollman |
| 6,118,894 | A | 9/2000 | Schwartz et al. | 6,771,090 | B2 | 8/2004 | Harris et al. |
| 6,121,783 | A | 9/2000 | Horner et al. | 6,771,806 | B1 | 8/2004 | Satya et al. |
| 6,124,723 | A | 9/2000 | Costello | 6,774,651 | B1 | 8/2004 | Hembree |
| 6,124,725 | A | 9/2000 | Sato | 6,777,964 | B2 | 8/2004 | Navratil et al. |
| 6,127,831 | A | 10/2000 | Khoury et al. | 6,788,093 | B2 | 9/2004 | Aitren et al. |
| 6,130,544 | A | 10/2000 | Strid et al. | 6,791,344 | B2 | 9/2004 | Cook et al. |
| 6,137,302 | A | 10/2000 | Schwindt | 6,801,047 | B2 | 10/2004 | Harwood et al. |
| 6,137,303 | A | 10/2000 | Deckert et al. | 6,806,724 | B2 | 10/2004 | Hayden et al. |
| 6,144,212 | A | 11/2000 | Mizuta | 6,836,135 | B2 | 12/2004 | Harris et al. |
| 6,147,851 | A | 11/2000 | Anderson | 6,838,885 | B2 | 1/2005 | Kamitani |
| 6,160,407 | A | 12/2000 | Nikawa | 6,842,024 | B2 | 1/2005 | Peters et al. |
| 6,194,907 | B1 | 2/2001 | Kanao et al. | 6,843,024 | B2 | 1/2005 | Nozaki et al. |
| 6,198,299 | B1 | 3/2001 | Hollman | 6,847,219 | B1 | 1/2005 | Lesher et al. |
| 6,211,663 | B1 | 4/2001 | Moulthrop et al. | 6,856,129 | B2 | 2/2005 | Thomas et al. |
| 6,222,970 | B1 | 4/2001 | Wach et al. | 6,861,856 | B2 | 3/2005 | Dunklee et al. |
| 6,232,787 | B1 | 5/2001 | Lo et al. | 6,873,167 | B2 | 3/2005 | Goto et al. |
| 6,232,788 | B1 | 5/2001 | Schwindt et al. | 6,885,197 | B2 | 4/2005 | Harris et al. |
| 6,232,789 | B1 | 5/2001 | Schwindt | 6,900,646 | B2 | 5/2005 | Kasukabe et al. |
| 6,232,790 | B1 | 5/2001 | Bryan et al. | 6,900,647 | B2 | 5/2005 | Yoshida et al. |
| 6,236,975 | B1 | 5/2001 | Boe et al. | 6,900,652 | B2 | 5/2005 | Mazur |
| 6,236,977 | B1 | 5/2001 | Verba et al. | 6,900,653 | B2 | 5/2005 | Yu et al. |
| 6,245,692 | B1 | 6/2001 | Pearce et al. | 6,902,941 | B2 | 6/2005 | Sun |
| 6,252,392 | B1 | 6/2001 | Peters | 6,903,563 | B2 | 6/2005 | Yoshida et al. |
| 6,257,319 | B1 | 7/2001 | Kainuma et al. | 6,927,079 | B1 | 8/2005 | Fyfield |
| 6,259,261 | B1 | 7/2001 | Engelking et al. | 7,001,785 | B1 | 2/2006 | Chen |
| 6,271,673 | B1 | 8/2001 | Furuta et al. | 7,002,133 | B2 | 2/2006 | Beausoleil et al. |
| 6,284,971 | B1 | 9/2001 | Atalar et al. | 7,002,363 | B2 | 2/2006 | Mathieu |
| 6,288,557 | B1 | 9/2001 | Peters et al. | 7,002,364 | B2 | 2/2006 | Kang et al. |
| 6,292,760 | B1 | 9/2001 | Burns | 7,003,184 | B2 | 2/2006 | Ronnekleiv et al. |
| 6,300,775 | B1 | 10/2001 | Peach et al. | 7,005,842 | B2 | 2/2006 | Fink et al. |
| 6,310,755 | B1 | 10/2001 | Kholodenko et al. | 7,005,868 | B2 | 2/2006 | McTigue |
| 6,313,649 | B2 | 11/2001 | Harwood et al. | 7,005,879 | B1 | 2/2006 | Robertazzi |
| 6,320,372 | B1 | 11/2001 | Keller | 7,006,046 | B2 | 2/2006 | Aisenbrey |

| | | |
|---|---|---|
| 7,007,380 B2 | 3/2006 | Das et al. |
| 7,009,188 B2 | 3/2006 | Wang |
| 7,009,383 B2 | 3/2006 | Harwood et al. |
| 7,009,415 B2 | 3/2006 | Kobayashi et al. |
| 7,011,531 B2 | 3/2006 | Egitto et al. |
| 7,012,425 B2 | 3/2006 | Shoji |
| 7,012,441 B2 | 3/2006 | Chou et al. |
| 7,013,221 B1 | 3/2006 | Friend et al. |
| 7,014,499 B2 | 3/2006 | Yoon |
| 7,015,455 B2 | 3/2006 | Mitsuoka et al. |
| 7,015,689 B2 | 3/2006 | Kasajima et al. |
| 7,015,690 B2 | 3/2006 | Wang et al. |
| 7,015,703 B2 | 3/2006 | Hopkins et al. |
| 7,015,707 B2 | 3/2006 | Cherian |
| 7,015,708 B2 | 3/2006 | Beckous et al. |
| 7,015,709 B2 | 3/2006 | Capps et al. |
| 7,015,710 B2 | 3/2006 | Yoshida et al. |
| 7,015,711 B2 | 3/2006 | Rothaug et al. |
| 7,019,541 B2 | 3/2006 | Kittrell |
| 7,019,544 B1 | 3/2006 | Jacobs et al. |
| 7,020,360 B2 | 3/2006 | Satomura et al. |
| 7,020,363 B2 | 3/2006 | Johannessen |
| 7,022,976 B1 | 4/2006 | Santana, Jr. et al. |
| 7,022,985 B2 | 4/2006 | Knebel et al. |
| 7,023,225 B2 | 4/2006 | Blackwood |
| 7,023,226 B2 | 4/2006 | Okumura et al. |
| 7,023,229 B2 | 4/2006 | Maesaki et al. |
| 7,023,231 B2 | 4/2006 | Howland, Jr. et al. |
| 7,025,628 B2 | 4/2006 | LaMeres et al. |
| 7,026,832 B2 | 4/2006 | Chaya et al. |
| 7,026,833 B2 | 4/2006 | Rincon et al. |
| 7,026,834 B2 | 4/2006 | Hwang |
| 7,026,835 B2 | 4/2006 | Farnworth et al. |
| 7,030,599 B2 | 4/2006 | Douglas |
| 7,032,307 B2 | 4/2006 | Matsunaga et al. |
| 7,034,553 B2 | 4/2006 | Gilboe |
| 7,035,738 B2 | 4/2006 | Matsumoto et al. |
| 7,101,797 B2 | 9/2006 | Yuasa |
| 2001/0009377 A1 | 7/2001 | Schwindt et al. |
| 2001/0010468 A1 | 8/2001 | Gleason et al. |
| 2001/0020283 A1 | 9/2001 | Sakaguchi |
| 2001/0030549 A1 | 10/2001 | Gleason et al. |
| 2002/0075027 A1 | 6/2002 | Hollman et al. |
| 2002/0118009 A1 | 8/2002 | Hollman et al. |
| 2003/0057513 A1 | 3/2003 | Leedy |
| 2003/0062915 A1 | 4/2003 | Arnold et al. |
| 2003/0071631 A1 | 4/2003 | Alexander |
| 2003/0141861 A1 | 7/2003 | Navratil et al. |
| 2004/0061514 A1 | 4/2004 | Schwindt et al. |
| 2004/0095145 A1 | 5/2004 | Boudiaf et al. |
| 2004/0100276 A1 | 5/2004 | Fanton |
| 2004/0113639 A1 | 6/2004 | Dunklee et al. |
| 2004/0162689 A1 | 8/2004 | Jamneala et al. |
| 2004/0193382 A1 | 9/2004 | Adamian et al. |
| 2004/0199350 A1 | 10/2004 | Blackham et al. |
| 2004/0207424 A1 | 10/2004 | Hollman |
| 2004/0251922 A1 | 12/2004 | Martens et al. |
| 2005/0024069 A1 | 2/2005 | Hayden et al. |
| 2005/0099192 A1 | 5/2005 | Dunklee et al. |
| 2005/0227503 A1 | 10/2005 | Reitinger |
| 2006/0114012 A1 | 6/2006 | Reitinger |
| 2006/0158207 A1 | 7/2006 | Reitinger |

FOREIGN PATENT DOCUMENTS

| | | |
|---|---|---|
| DE | 31 25 552 | 11/1982 |
| DE | 288 234 | 10/1983 |
| DE | 41 09 908 | 10/1992 |
| DE | 693 22 206 | 5/1993 |
| DE | 94 06 227 | 4/1994 |
| DE | 43 16 111 | 11/1994 |
| DE | 29 12 826 | 9/1996 |
| DE | 195 41 334 | 9/1996 |
| DE | 196 16 212 | 10/1996 |
| DE | 196 18 717 | 1/1998 |
| EP | 0 087 497 | 9/1983 |
| EP | 0 201 205 | 12/1986 |
| EP | 0 314 481 | 5/1989 |
| EP | 0 333 521 | 9/1989 |
| EP | 0 460 911 | 12/1991 |
| EP | 0 505 981 | 9/1992 |
| EP | 0 574 149 | 12/1993 |
| EP | 0 706 210 | 4/1996 |
| EP | 0 573 183 | 1/1999 |
| GB | 2 197 081 | 5/1988 |
| JP | 53-052354 | 5/1978 |
| JP | 56-007439 | 1/1981 |
| JP | 62-011243 | 1/1987 |
| JP | 63-143814 | 6/1988 |
| JP | 63-160355 | 7/1988 |
| JP | 1-165968 | 6/1989 |
| JP | 1-178872 | 7/1989 |
| JP | 1-209380 | 8/1989 |
| JP | 1-214038 | 8/1989 |
| JP | 1-219575 | 9/1989 |
| JP | 1-296167 | 11/1989 |
| JP | 2-22837 | 1/1990 |
| JP | 2-22873 | 1/1990 |
| JP | 2-220453 | 9/1990 |
| JP | 3-67187 | 3/1991 |
| JP | 3-175367 | 7/1991 |
| JP | 4-732 | 1/1992 |
| JP | 5-157790 | 6/1993 |
| JP | 5-166893 | 7/1993 |
| JP | 60-71425 | 3/1994 |
| JP | 7-5197 | 1/1995 |
| JP | 7005078 | 1/1995 |
| JP | 7-273509 | 10/1995 |
| JP | 10-116866 | 5/1998 |
| JP | 10-339743 | 12/1998 |
| JP | 11-031724 | 2/1999 |
| JP | 2001-189285 | 7/2001 |
| JP | 2001-189378 | 7/2001 |
| JP | 2002033374 | 1/2002 |
| JP | 2002-164396 | 6/2002 |
| WO | WO80/00101 | 1/1980 |
| WO | WO86/07493 | 12/1986 |
| WO | WO89/04001 | 5/1989 |
| WO | WO 01/69656 | 9/2001 |
| WO | WO 2004/049395 | 6/2004 |

OTHER PUBLICATIONS

John A. Modolo, Gordon Wood Anderson, Francis J. Kub, and Ingham A.G. Mack, "Wafer level high-frequency measurements of photodetector characteristics," Applied Optics, vol. 27, No. 15, Aug. 1, 1988, pp. 3059-3060.

Cascade Microtech, "Introducing the peak of analytical probe stations," MicroProbe Update, May 1990.

H.-J. Eul and B. Schiek, "Thru-Match-Reflect: One Result of a Rigorous Theory for De-Embedding and Network Analyzer Calibration," 18th Euopean Microwave Conference '88, The International Conference Designed for the Microwave Community, Published by Microwave Exhibitions and Publishers Limited, Sep. 12-16, 1988, Stockholm, Sweden.

Cascade Microtech, "Analytical Probe Station," Summit 9000 Series, Jun. 1, 1990.

Maury Microwave Corporation, "MT950D Series, Transistor Test Fixture Software, Software Application Packs," Sep. 20, 1982.

Signatone S-1240 Thermal Controller, 2 page description.

Eric Phizicky, Philippe I.H. Bastiaens, Heng Zhu, Michael Snyder, & Stanley Fields, "Protein analysis on a proteomic scale," Nature 422, insight: review article, Mar. 13, 2003.

The Micromanipulator Company, "Semi-Automatic Probing Stations and Accessories," pp. 1-12.

Integrated Technology Corporation, "Probilt PB500A Probe Card Repair and Analysis Station," 4 pages.

Brian J. Clifton, "Precision slotted-Line Impedance Measurements Using computer Simulation for Data Correction," IEEE Transactions on Instrumentation and Measurement, vol. IM-19, No. 4, Nov. 1970, pp. 358-363.

Eric Strid (Cascade Microtech), "Planar Impedance Standards and Accuracy Considerations in Vector Network Analysis," Jun. 1986, 8 pages.

J. Martens, Anritsu Company, 490 Jarvis Drive, Morgan Hill, CA 95037, "Multiport SOLR Calibrations: Performance and an Analysis of some Standards Dependencies," pp. 205-213.

Maury Microwave Corporation, "MT950 Series Transistor Test Fixture (TTF) Notice! Notice! Notice!," May 31, 1985.

Maury Microwave Corporation, MT950 Series Transistor Test Fixture (TTF), Oct. 7, 1982, 4 pages.

Temptronic Corporation, "Model TPO3000 Series ThermoChuck Systems for Probing, Characterization and Failure analysis of Wafers, Chips and Hybrids at High and Low Temperatures," pp. 2-5.

Cascade Microtech, "Model 42/42D Microwave Probe Station Instruction Manual, Electrical Operation," pp. 4-1-4-42.

Inter-Continental Microwave, "Microwave Semiconductor Chip Measurements using the HP 8510B TRL-Calibration Technique," Application Note: 101.

Design Technique, "Microstrip Microwave Test Fixture." May 1986, 2 pages.

Photo: Micromanipulator Probe Station 1994.

Micromanipulator Sales and Services Inc., "Test Station Accessories," Copyright 1983, 1984, 1 page.

Ruedi Aebersold & Matthias Mann, "Insight Review Articles, Mass spectrometry-based proteomics," Nature, vol. 422, Mar. 13, 2003, pp. 198-207.

Keithley Instruments, Inc. "Low-Level Measurements for Effective Low Current, Low Voltage, and High Impedance Measurements," Revised Third Edition, Printed Jun. 1984.

Inter-Continental Microwave, 2370-B Walsh Avenue, Santa Clara, CA 95051, "Product Catalog,".

Hewlett Packard, "HP 4284A Precision LCR Meter Operation Manual (Including Option 001,002,006,201,202,301)," Third Edition, Dec. 1991, pp. 2-1, 6-9, 6-15.

Cletus A Hoer, "A High-Power Dual Six-Port Automatic Network Analyzer Used in Determining Biological Effects of RF and Microwave Radiation," IEEE Transactions on Microwave Theory and Techniques, vol. MTT-29, No. 12, Dec. 1981.

Cascade Microtech Technical Brief, A Guide to Better Vector Network Analyzer Calibrations for Probe-Tip Measurements, Copyright 1994, 2 pages.

Temptronic, "Guarded" Chuck Sketch, Nov. 15, 1989.

Arthur Fraser, Reed Gleason, E.W. Strid, "GHz On-Silicon-Wafer Probing Calibration Methods," Cascade Microtech Inc. P.O. Box 1589, Beaverton, OR 97075-1589, pp. 5-8.

Andrej Sali, Robert Glaeser, Thomas Earnest & Wolfgang Baumeister, "From words to literature in structural proteomics," Insight: Review Article, Nature 422, pp. 216-225, Mar. 13, 2003.

Mike Tyers & Matthias Mann, "From genomics to proteomics," Insight overview, Nature vol. 422 Mar. 2003, pp. 193-197.

William Knauer, "Fixturing for Low-Current/Low-Voltage Parametric Testing," Evaluation Engineering, Nov. 1990, pp. 9-12.

J.D.Tompkins, "Evaluating High Speed AC Testers," IBM Technical Disclosure Bulletin, vol. 13, No. 7 Dec. 1970, p. 180.

Jim Fitzpatrick, "Error Models for Systems Measurement," Microwave Journal, May 1978, pp. 63-66.

Sam Hanash, "Disease proteomics," Insight Review Articles, Nature, vol. 422, Mar. 13, 2003, pp. 226-232.

Design Technique International, "Adjustable Test Fixture," Copyright 1988.

Ronald F. Bauer & Paul Penfield, Jr., "De-Embedding and Unterminating," IEEE Transactions on Microwave Theory and Techniques, vol. MTT-22, No. 3, Mar. 1974, pp. 282-288.

Cross Section—Signatone S-1240 Sketch, Advertised & Sold 1987-1988.

Yousuke Yamamoto, "A Compact Self-Shielding Prober for Accurate Measurement of On-Wafer Electron Devices," IEEE Transactions on Instrumentation and Measurement, vol. 38, No. 6, Dec. 1989, pp. 1088-1093.

R. Y. Koyama & M. G. Buehler, "Semiconductor Measurement Technology: A Wafer Chuck for Use Between-196 and 350° C," U.S. Department of Commerce, National Technical Information Service, PB-293 298, Issued Jan. 1979.

Ken Cole, "ThermoChuck Performance (Fax)," 2 pages, Mar. 10, 1995.

S. Beck & E. Tomann, "Chip Tester," IBM Technical Disclosure Bulletin, Jan. 1985.

Applied Precision, "Checkpoint," 2 pages, 8505 SE 68$^{th}$ Street, Mercer Island, Washington 98040.

L. L. Sohn, O. A. Saleh, G. R. Facer, A. J. Beavis, R. S. Allan, & D. A. Notterman, "Capacitance Cytometry: Measuring biological cells one by one," PNAS vol. 97, No. 20 Sep. 26, 2000, pp. 10687-10690.

Daniel Van Der Weide, "THz Frequency Science & Technology Biomolecular Interaction Sensing with Sub-Terahertz Fields," University of Wisconsin-Madison, 2 pages.

Mark S. Boguski & Martin W. McIntosh, "Biomedical informatics for proteomics," Insight: review article, Nature 422, Mar. 13, 2003, pp. 233-237.

Saswata Basu & Reed Gleason, "A Membrane Quadrant Probe for R&D Applications," Cascade Microtech, Inc. 14255 SW Brigadoon Ct., Beaverton, OR 97005, 3 pages.

The Micromanipulator Company, Inc., "Model 8000 Test Station," 1986, 1 page.

The Micromanipulator Company, Inc. "Model 8000 Test Station," 1988, 1 page.

"Vacuum," Mechanical Operation, pp. 3-8-3-9.

The Micromanipulator Company, Inc., "Accessories: Hot and Hot/Cold Chucks, Integrated Dry environments, Triaxial chucks, Integrated Shielded and Dark environments, Probe Card Holders" p. 8.

Microwave Products, Microwave Journal, Sep. 1988, 1 page.

Cascade Microtech, "Advanced On-Wafer Device Characterization Using the Summit 10500," pp. 2-20.

Saswata Basu & Leonard Hayden, "An SOLR Calibration for Accurate Measurement of Orthogonal On-Wafer Duts," IEEE MTT-S Digest, 1997, pp. 1335-1336, 1338.

Hewlett Packard, "HP 4142B Modular DC source/Monitor Practical Applications—High Speed DC Characterization of Semiconductor Devices from Sub pA to 1A," Nov. 1987, pp. 1-4.

Doug Rytting, "Appendix to an Analysis of Vector Measurement Accuracy Enhancement Techniques," pp. 1-42, Hewlett Packard.

Temptronic Corporation, "Application Note 1 Controlled Environment Enclosure For low temperature wafer probing in a moisture-free environment," 2 pages.

*Cascade Microtech, Inc.* vs. *Micromanipulator Company, Inc.*, "Deposition of Harry F. Applebay," United States District Court for the District of Oregon, Lead Case No. 97-479-AI.

Flexion Corporation, "Cryotest Station MP-3," *Cascade Microtech, Inc.* vs. *Micromanipulator Company, Inc.*, Applebay Exhibit 576, May 13, 1998, 68 pages.

Flexion Corporation, "Cryotest Station MP-3," *Cascade Microtech, Inc.* vs. *Micromanipulator Company, Inc.*, Applebay Exhibit 578, May 13, 1998, 1 page.

*Cascade Microtech, Inc.* vs. *Micromanipulator Company, Inc.*, Applebay Exhibit 572, May 13, 1998, 2 pages.

*Cascade Microtech, Inc.* vs. *Micromanipulator Company, Inc.*, Applebay Exhibits 581A, 581B, and 581C, May 13, 1998, 3 pages.

Flexion Corporation, "AP-1 Cryotest Station," Applebay Exhibit 582, May 13, 1998, 20 pages.

Flexion Corporation, "AP-1 Cryotest Station User Manual," Applebay Exhibit 583, May 13, 1998, 187 pages.

*Cascade Microtech, Inc.* vs. *Micromanipulator Company, Inc.*, Applebay Exhibits 577A, 577B, 577C, May 13, 1998, 3 pages.

*Cascade Microtech, Inc.* vs. *Micromanipulator Company, Inc.*, Applebay Exhibit 585, May 13, 1998, 7 pages.

\* cited by examiner

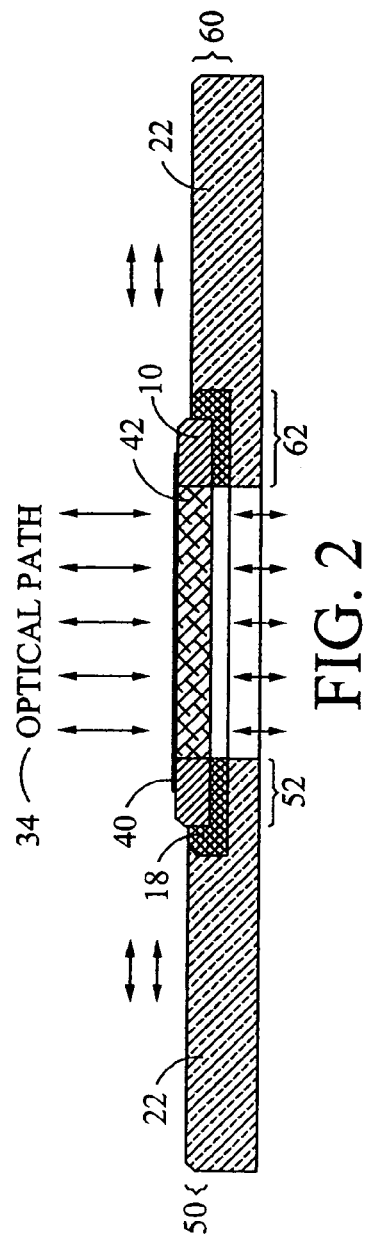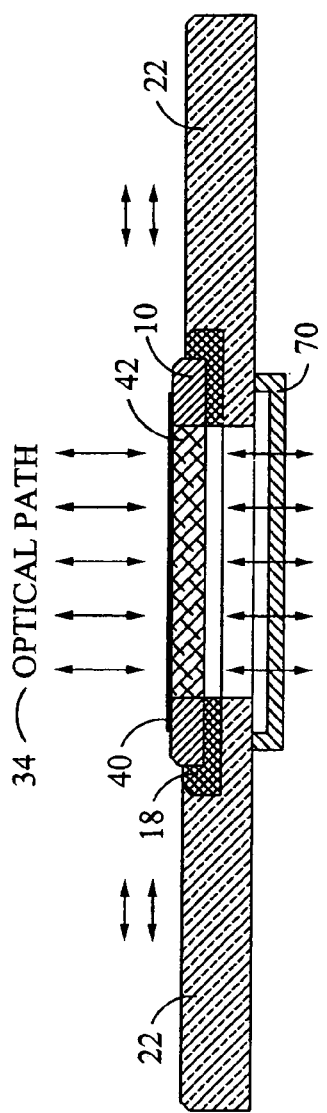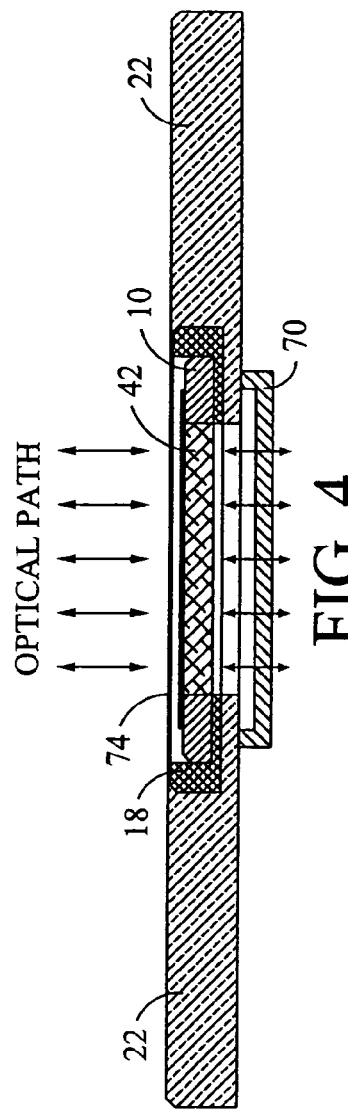

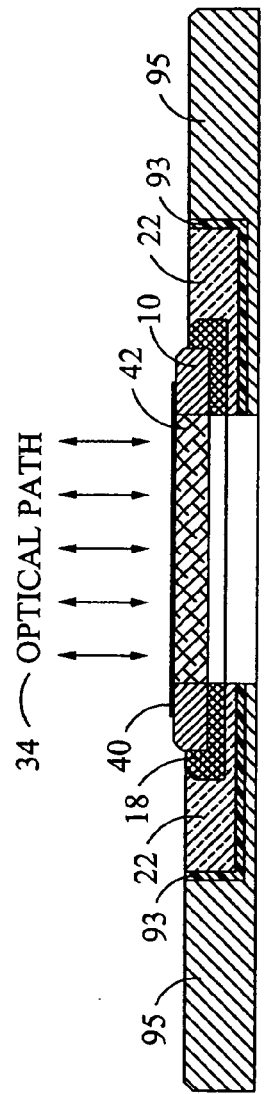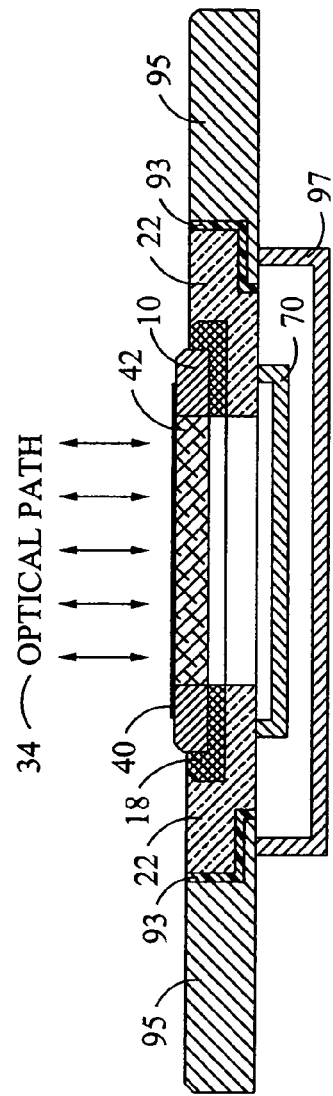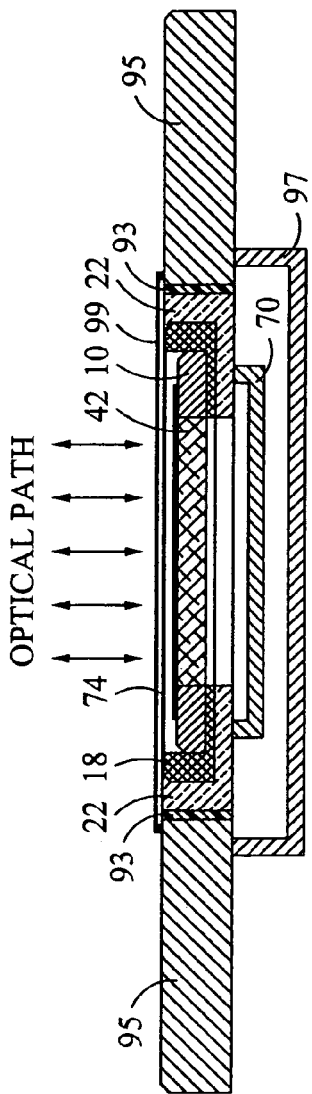

OPTICAL TESTING DEVICE

This application claims priority of U.S. patent application Ser. No. 10/214,888 filed Aug. 7, 2002 entitled Optical Testing Device, now U.S. Pat No. 6,836,135, which claims the benefit of 60/316,644 filed Aug. 31, 2001.

BACKGROUND OF THE INVENTION

The present invention is directed to a chuck adapted to test electrical and/or optical components on a device-under-test (DUT).

Guarding systems suitable to reduce leakage currents during low current measurements are well known and discussed extensively in the technical literature. See, for example, an article by William Knauer entitled "Fixturing for Low Current/Low Voltage Parametric Testing" appearing in *Evaluation Engineering*, November, 1990, pages 150-153. Probe stations employing such a guarding system typically route a test signal to selected contact pads on the device-under-test (DUT) and route a guard signal to electrically conductive material surrounding the DUT on several sides, separated from the device-under-test by dielectric material (e.g., air). The guard signal preferably closely approximates the test signal or otherwise follows the test signal, thus reducing electromagnetic leakage currents that might otherwise occur.

Frequently, such probe stations also provide an electrically conductive enclosure around the perimeter of the probe station connected to a shield potential. The shield potential is typically connected to earth ground, instrumentation ground, or some other suitable potential. See, for example, Peters et al., U.S. Pat. No. 6,002,263.

To provide effective guarding and shielding for probe stations, a multi-stage chuck upon which the device-under-test rests during testing may likewise be used. The upper stage of the chuck, which supports the device-under-test, typically includes an electrically conductive metal layer through which the test signal may be routed. A middle stage and a lower stage of the chuck similarly include an electrically conductive metal layer to which a guard signal and a shield signal may be imposed, respectively. In this fashion, a device-under-test resting on such a multistage chuck may be both guarded and shielded from below. Some probe stations also provide for guarding from the sides and from above.

Many electrical devices, in particular semiconductor based devices, include both electrical components and optical components. Some optical components receive an optical signal from an optical source and convert the received optical signal into an electrical signal, e.g., a photo-detector. Other optical components convert an electrical signal into an optical signal, e.g., a light-emitting-diode. Yet other optical components may include multiple optical and/or electrical components. Frequently, a probe station may be used to test the electrical components.

Unfortunately, the aforementioned probe stations are not suitable for testing optical components because there is no optical path through the chuck itself. Accordingly, a different type of chuck, namely an optical chuck, is used for testing devices that include optical components. An optical chuck typically includes an central optically transparent medium over which the device-under-test is supported. For example, an optical signal from a light source may be directed toward the device-under-test from below, above, or to the side of the optical chuck, and a probe or connector used to sense the resulting electrical output from the device-under-test. Similarly for example, a probe or connector may be used to provide an electrical source to the device-under-test, and an optical sensing device located below, above, or to the side of the optical chuck to sense the resulting optical output from the device-under-test. Accordingly, the probe station is used to provide a shielded environment from exterior electromagnetic noise so that the input-output characteristics of an optical device-under-test may be performed. It may be observed that the testing of the optical components on the device-under-test is performed by observing the input and output characteristics of the device which normally have significant voltage and/or current levels (or optical power) making measurements easily performed.

BRIEF DESCRIPTION OF THE DRAWINGS

FIG. 2 is a cross sectional view of an optical chuck.

FIG. 3 is a cross sectional view of an alternative optical chuck.

FIG. 4 is a cross sectional view of yet another alternative optical chuck.

FIG. 6 is a cross sectional view of an optical chuck.

FIG. 7 is a cross sectional view of an alternative optical chuck.

FIG. 8 is a cross sectional view of yet another alternative optical chuck.

DETAILED DESCRIPTION OF THE PREFERRED EMBODIMENT

The traditional approach to optical testing involves testing the inputs and outputs of a device-under-test with an optical sensor(s), a connector(s), and/or an electrical probe(s). Based upon using the sensor, the connector, and/or electrical probe the overall operational characteristics of the device-under-test may be characterized. The present inventors came to the realization that together with optical testing there is a previously unrealized need to achieve performance levels that were previously not considered needed, namely ultra low noise and low current measurements. In particular, the present inventors determined that unlike measuring the operational inputs and/or outputs of the device-under-test which are sufficiently accurately measured using only a shielded environment because the noise levels are relatively low and the current levels are relatively high, measurements of other electrical characteristics of the device-under-test apart from the operational inputs and/or outputs are desirable. For example, low current measurements with a high degree of accuracy may be desirable of a portion of the electrical aspects of the optical device-under-test, such as the leakage currents of a junction for a light emitting diode.

Figure 1:
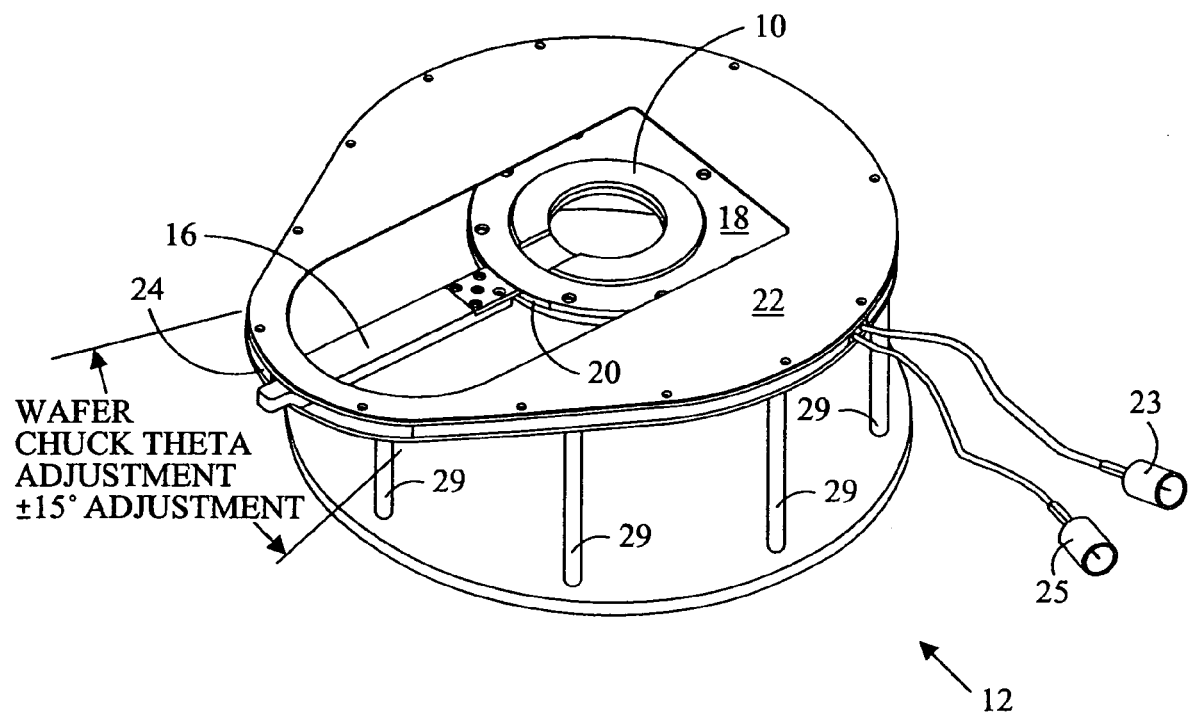
FIG. 1 is a perspective view of a portion of a wafer probe station having a chuck.

FIG. 1 illustrates a chuck 10 suitable for use with a support 12 within a probe station for testing a device-under-test. The perimeter region of the chuck 10 is preferably electrically conductive and is supported around its periphery by an insulating member 18. The insulating member 18 maintains the chuck 10 in a fixed elevational position with respect to each other. The insulating member 18 may include a handle 16 that passes through a slotted opening 20 to permit rotation of the chuck 10, and hence the device-under-test supported thereon, for alignment. The insulating member 18, and hence the chuck 10 supported thereon, are slidably engaged with a conductive member 22. The handle 16 may extend from a slot 24 beneath the conductive member 22. The handle 16 may be used to laterally move the chuck 10 for easier loading and unloading of a device-under test on the chuck 10. Preferably, the conductive member is at least partially laterally surrounding and/or at least laterally spaced apart from the chuck 10 and/or the insulating member 18. In addition to a connector 23, probes may be used to provide a test signal to the device under test or otherwise sense a signal from the device under test. An optical sensing device (not shown) may be included under the conductive member 22 within the region defined by the supports 29. Alternatively, the optical sensing device may be included above the conductive member 22 or to the side thereof. As shown in FIG. 1, the device-under-test may be tested in an environment that includes a guard potential proximate thereof by connecting the conductive member 22 to the guard potential, which permits effective testing at leakage current levels not previously obtainable, nor thought desirable, with existing optical probes. For example, the guarding of the optical chuck of FIG. 1 resulted in a reduction greater than several orders of magnitude in stray capacitance (force to shield).

The support 12 may include one or more connectors 23 to the chuck 10. The connector 23 is preferably a co-axial or tri-axial connector providing a force test signal to the device under test. Also, multiple connectors 23 may be used to provide a Kelvin connection and/or a quasi-Kelvin connection to the device-under-test. In addition, the support 12 may include one or more connectors 25 to provide a sense signal to the conductive member 22. The guard braid on the connector 23 and/or connector 25 may be electrically connected to the conductive member 22.

While the chuck 10 design facilitates improved testing of the device-under-test, at leakage current levels not previously considered obtainable, a tendency for breaking the device-under-test occurs when undergoing pressure as a result of probes. In addition, the device-under-test has a tendency to warp or otherwise become non-uniform as a result of the central region of the device-under-test not being supported. Referring to FIG. 2, the chuck 10 may further include a central region having an optically transmissive (e.g., transparent) material 42 to the wavelength used for testing. The optically transmissive material 42 is preferably co-planar (or substantially co-planar) with the chuck 10 supporting the device-under-test 40 so that the device-under-test is supported in face-to-face contact over at least a majority of its surface area. Also, the optically transmissive material 42 preferably occupies at least a majority of the lateral spatial extent of the opening (i.e., not the depth) defined by the chuck 10. With the optically transmissive material 42 in the optical path of the device-under-test light may readily pass through the opening in the chuck 10.

The insulating member 18 may include a raised portion 50 and an inset portion 52. The raised portion 50 forms a perimeter having an inner diameter substantially equal to the outer diameter of the chuck 10 which maintains the chuck 10 within the inset portion 52. The inset portion 52 preferably has an inner diameter substantially equal to the inner diameter of the chuck 10 so as to form a substantially continuous boundary for the optical path 34.

In a similar fashion, the conductive member 22 may include a raised portion 60 and an inset portion 62. The raised portion 60 provides a surface having an inner shape, such as a pair of co-planar surfaces, substantially equal to the exterior width of the raised portion 50 of the insulating member 18. In this manner, the insulating member 18 may be positioned within the conductive member 22. The inset portion 62 of the conductive member 22 has an inner diameter substantially equal to the inner diameter of the inset portion 52 and the chuck 10 so as to form a substantially continuous boundary for the optical path 34.

Devices within the optical path 34 may include materials that are optically transparent to the wavelength of the optical signal. A variety of commercially available materials are suitable for use as the optical chuck material 42, such as for example, quartz, sapphire, lithium niobate, and silicon.

After consideration of the support shown in FIG. 2, the present inventors came to the realization there exists a region which is substantially unguarded, namely, the region below the device under test. Initially it would seem that this region below the device-under-test will remain unguarded because placing a conductive member in the optical path would inhibit sensing the optical signal from the device or providing an optical signal to the device. After further consideration, the seemingly unavailability of a conductive member may be overcome by including an optically transmissive conductive material connected to a guard potential in the optical path below the device-under-test. Referring to FIG. 3, a lower optically transmissive conductive material 70 may be positioned in the optical path and electrically interconnected to the conductive member 22 to provide more complete guarding for the device-under-test, if desired. Alternatively, a non-conductive optically transparent material coated with an optically transparent material such as indium-tin-oxide, electrically interconnected to the conductive member 22 may be used.

After consideration of the supports shown in FIGS. 2 and 3, the present inventors came to the realization there exists a region which remains substantially unguarded, namely, the region above the device under test. Initially it would seem that this region above the device-under-test will remain unguarded because placing a conductive member in the optical path is seemingly difficult. After further consideration, the seemingly unavailability of a conductive member may be overcome by relocating the device-under-test and including an optically transmissive conductive material 74 in the optical path above the device-under-test, such as shown in FIG. 4. Alternatively, a non-conductive optically transparent material coated with an optically transparent material, such as indium-tin-oxide, electrically interconnected to the conductive member 22 may be used.

It is to be understood that the orientation of the device-under-test is shown with the device-under-test on the top with the chuck thereunder. It is to be understood that the testing may be performed with the orientation of the device-under-test and/or chuck (etc.) in an inverted orientation.

The preferred embodiment of the support 12 provides a wafer supporting surface capable of providing a test signal and a guard member 22 that, in conjunction with the lower guard member 70, allows the signal provided to or received from the device-under-test to be electrically guarded. The support 12 also provides an environment suitable for low current low leakage measurements for an optical device so that the device-under test need not be transferred between an optical chuck in an optical probe station and a traditional chuck in an electrical probe station for the testing of optical components and electrical components, respectively, that may be included within the device-under-test.

Generally speaking, chucks used to support a DUT during both electrical and optical testing needs to provide a stable surface where the DUT is held in place while testing is performed. In this regard, a number of chucks, appropriately called vacuum chucks, use vacuum pressure to hold the DUT in place. One problem with existing vacuum chucks is that when testing a DUT on a wafer that has been broken, the vacuum pressure provided by the chuck tends to deform the wafer because the chuck was only designed to hold a full wafer.

Figure 5:
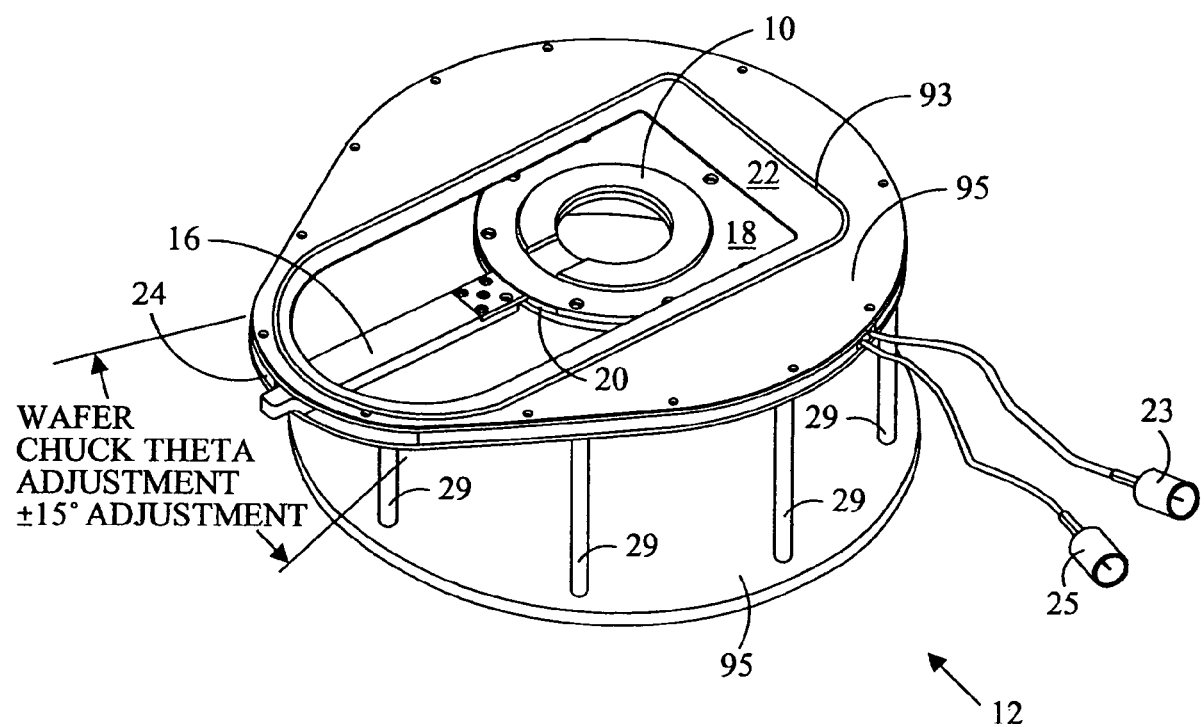
FIG. 5 is a perspective view of a portion of a wafer probe station having a chuck.

After further consideration the present inventors determined that further improvements in the measurement levels may be achieved by incorporating a shield potential within the support. Referring to FIG. 5, an additional insulator 93 may surround the conductive member 22. Around the perimeter of the additional insulator 93 is another conductive member 95. The conductive member 22 is preferably connected to a guard potential while the another conductive member 95 is connected to a shield potential. The shield potential may be provided in any suitable manner, such as for example, the shield braid of the connector 23 and/or the connector 25. Referring to FIG. 6, the another conductive member 95 may extend to the optical path 34. Referring to FIG. 7, the another conductive member 95 may be terminate prior to the optical path 34. Moreover, an optically transmissive conducive material or non-conductive optically transmissive material with a conductive coating, generally referred to as material 97, may be provided within the optical path and connected to shield. Referring FIG. 8, yet another conductive member 95 may be terminate prior to the optical path 34. Moreover, an optically transmissive conducive material or non-conductive optically transmissive material with a conductive coating, generally referred to as material 99, may be provided within the optical path and connected to shield. As it may be observed, the guard and/or shield environment may be extended in a lateral direction, and the guard and/or shield environment may be extended in a vertical direction, as desired.

Figure 9:
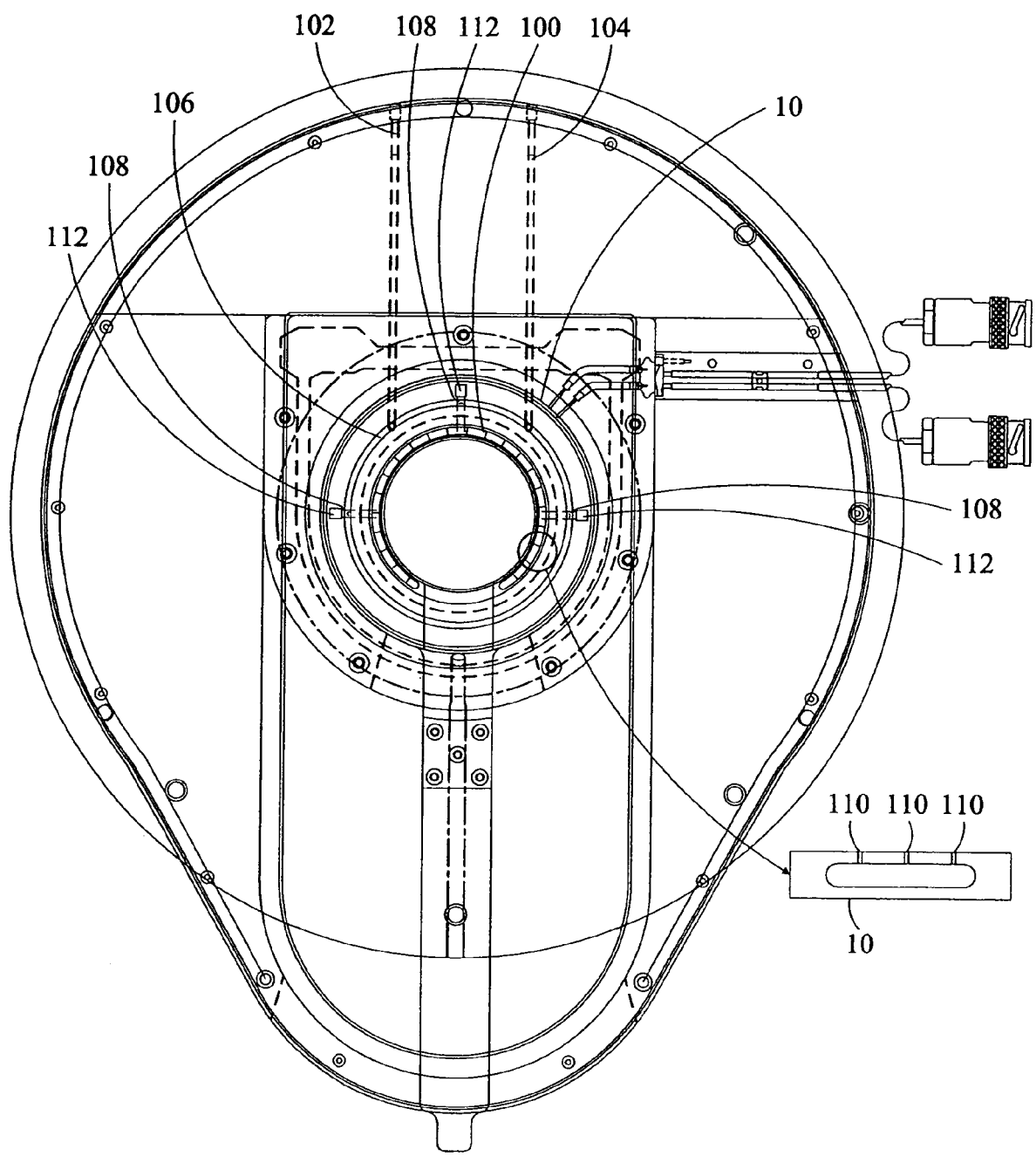
FIG. 9 is a top view of the wafer probe station shown in FIG. 1 illustrating a selective vacuum positioning system.

Referring to FIG. 9, the chuck 10 may include a vacuum chamber 100 comprising an approximate ring of about 270 degrees around the midpoint of the chuck 10. The vacuum chamber 100 may encircle the entire chuck or less than 270 degrees, as desired. A vacuum source (not shown) operates to provide a vacuum and is operatively connected to the vacuum chamber through vacuum supply lines 102 and 104, a vacuum supply chamber 106, and three vacuum shafts 108. Vacuum pressure present within the vacuum chamber 108 is transmitted to the surface of the chuck 10 through small apertures 110.

The vacuum shafts 108 (or otherwise a passage or chamber) are preferably positioned at 0 degrees, 90 degrees, and 270 degrees around the vacuum chamber 100, respectively. A plug 112 each vacuum shaft, respectively, may be used to selectively isolate portions of the vacuum chamber 100 from the vacuum source. For example, if the vacuum source supplies vacuum pressure through vacuum supply line 104, and the plugs 112 associated with the vacuum shafts 108 at 0 and 90 degrees respectively are activated, then a quarter section of the chuck is providing vacuum pressure to the wafer. Similarly, if the vacuum member is supplying vacuum pressure through either vacuum supply line 102 or vacuum supply line 104, or both, and the plugs 112 at 90 degrees and 270 degrees, respectively, are activated, then a half-section of the chuck is providing vacuum pressure to the wafer. The selective activation of different regions of the vacuum chamber of the chuck in non-concentric rings permits fragments of a semiconductor device to be effectively tested. For example, if a fragment of a semiconductor is available then one or more regions may be interconnected to the vacuum source to maintain the fragment properly positioned on the chuck 10. By disabling the vacuum for the non-used portions of the chuck the vacuum pressure may be more readily controlled and improves the vacuum by reducing leaks. Moreover, if a significant number of small apertures 110 are not covered with a respective device-under-test then the resulting vacuum pressure for the small apertures 110 under the device-under-test may not sufficient vacuum pressure to maintain sufficient pressure. It is to be understood that other patterns of vacuum holes may likewise be used where groups of one or more vacuum holes may be selectively enabled. Also, the different regions may include at least one of the same holes, if desired. The patterns of the vacuum holes preferably include at least one selectable region that is in a non-concentric region. Also, a switching mechanism may be used to select which of the vacuum regions provide a vacuum to the surface of the chuck. In addition, a selectable vacuum source may be provided to each vacuum region.

Figure 10:
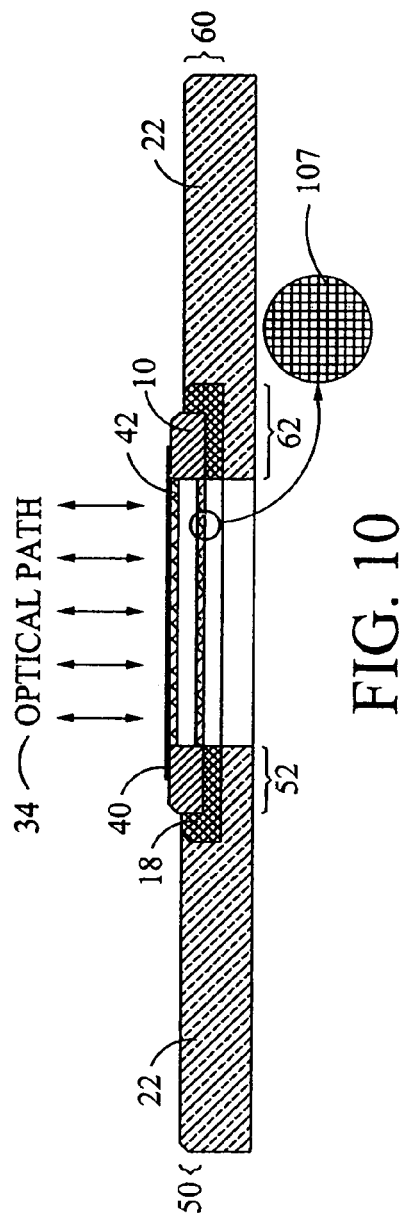
FIG. 10 is a cross sectional view of an optical chuck.
Figure 11:
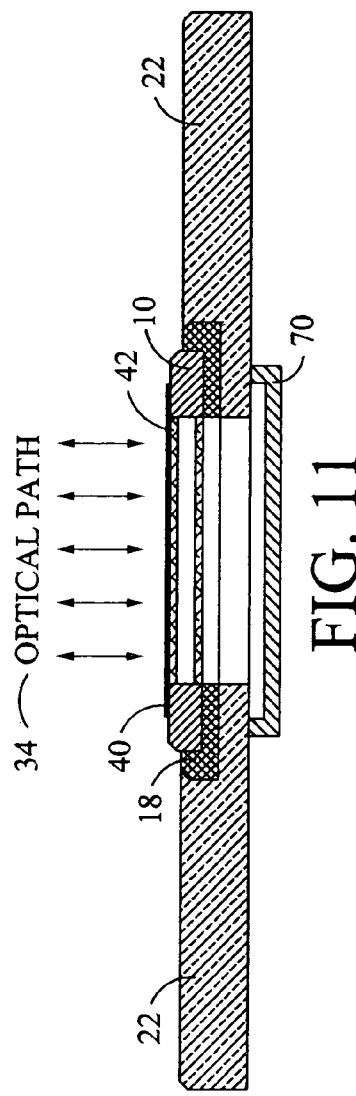
FIG. 11 is a cross sectional view of an alternative optical chuck.
Figure 12:
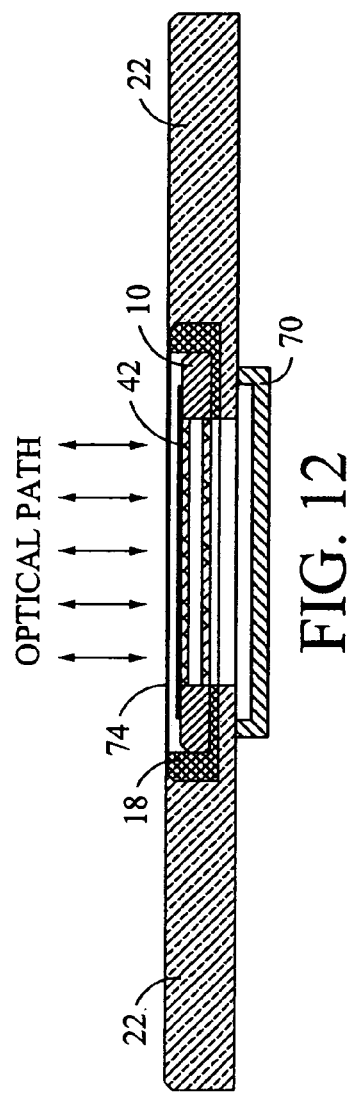
FIG. 12 is a cross sectional view of yet another alternative optical chuck.

After further consideration of the planarity of the device-under-test it is preferable to include vacuum holes within the optically transmissive material. Accordingly, a pair of spaced apart transmissive plates with an opening defined therein to which a vacuum is provided may be used with holes in the upper plate to provide a vacuum to the upper surface. However, using sufficiently thick spaced apart glass plates to provide structural integrity to the wafer results in excessive refraction of the optical signal. Also, using sufficiently thin spaced apart glass plates results in deflection of the supporting glass, and thus the wafer, which distorts the measurements. Referring to FIGS. 10, 11, and 12, to overcome this limitation a pair of optically transmissive plates preferably include a web material, such as a honeycomb pattern, between the two plates to provide structural support. Preferably the web material extends between and interconnects the two plates to provide structural support. The web material may be in any suitable pattern, such as for example, a grid pattern or stripes. In addition, the web material may likewise provide selective vacuum zones to the upper surface.

All references cited herein are incorporated by reference.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

The invention claimed is:

1. A test assembly comprising:
    (a) a chuck having a surface for supporting a device under test;
    (b) a plurality of vacuum apertures defined by said surface;
    (c) a vacuum system suitable to provide a vacuum to said plurality of vacuum apertures, said vacuum system comprising a vacuum source that supplies a vacuum to a first vacuum chamber defined within said chuck, said first vacuum chamber being interconnected with a second vacuum chamber, also defined within said chuck, by a plurality of vacuum shafts, said second vacuum chamber interconnected with said surface through said plurality of vacuum apertures; and (d) a selection mechanism suitable to selectively isolate one or more sets of said plurality of vacuum apertures from said vacuum when one or more other sets of said plurality of vacuum apertures are provided with said vacuum.

2. The test assembly of claim 1 wherein said selection mechanism comprises at least one member that selectively isolates a portion of said second vacuum chamber from said first vacuum chamber.

3. The test assembly of claim 1 wherein at least two of said different sets include a common one of said plurality of vacuum apertures.

4. The test assembly of claim 1 having plural sets of said plurality of vacuum apertures, and wherein at least one of said sets is non-concentric with respect to another one of said sets.

* * * * *

UNITED STATES PATENT AND TRADEMARK OFFICE
CERTIFICATE OF CORRECTION

| | | |
|---|---|---|
| PATENT NO. | : 7,268,533 B2 | Page 1 of 1 |
| APPLICATION NO. | : 10/912789 | |
| DATED | : September 11, 2007 | |
| INVENTOR(S) | : Daniel L. Harris et al. | |

It is certified that error appears in the above-identified patent and that said Letters Patent is hereby corrected as shown below:

<u>Col. 5, line 31</u>
Change "Referring FIG. 8" to --Referring to FIG. 8--.

<u>Col. 6, line 12</u>
Change "may not sufficient vacuum" to --may not be sufficient vacuum--.

Signed and Sealed this

Thirteenth Day of May, 2008

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,268,533 B2 | Page 1 of 1 |
| APPLICATION NO. | : 10/912789 | |
| DATED | : September 11, 2007 | |
| INVENTOR(S) | : Daniel L. Harris and Peter R. McCann | |

It is certified that error appears in the above-identified patent and that said Letters Patent is hereby corrected as shown below:

Title Pg, after Item (65) Prior Publication Data, and before Item (51) Int. Cl., please insert the following:

-- Related U.S. Application Data

(63) Continuation of application No. 10/214,888, filed on August 7, 2002, now Pat. No. 6,836,135.

(60) Provisional application No. 60/316,644, filed on August 31, 2001. --

Signed and Sealed this
Eighth Day of May, 2012

David J. Kappos
*Director of the United States Patent and Trademark Office*